United States Patent
Hidaka

(10) Patent No.: US 9,473,016 B2
(45) Date of Patent: Oct. 18, 2016

(54) SEMICONDUCTOR DEVICE AND POWER SOURCE CONTROL METHOD

(71) Applicant: LAPIS SEMICONDUCTOR CO., LTD., Yokohama-Shi, Kanagawa (JP)

(72) Inventor: Yuto Hidaka, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 14/455,393

(22) Filed: Aug. 8, 2014

(65) Prior Publication Data
US 2015/0048813 A1    Feb. 19, 2015

(30) Foreign Application Priority Data
Aug. 14, 2013  (JP) .................. 2013-168675

(51) Int. Cl.
*H02M 1/36*     (2007.01)
*H03K 19/0185*  (2006.01)

(52) U.S. Cl.
CPC ....... *H02M 1/36* (2013.01); *H03K 19/018521* (2013.01)

(58) Field of Classification Search
CPC ............... H03K 19/00; H03K 19/948; H03K 19/018521; H03K 17/22; H03K 17/687; H03K 19/0185; H02M 1/36; G06F 1/26

USPC .................................................. 323/311, 312
See application file for complete search history.

(56) References Cited

U.S. PATENT DOCUMENTS

| | | | | |
|---|---|---|---|---|
| 6,727,681 B2* | 4/2004 | Morita | ................. | G09G 3/3611 323/282 |
| 8,659,916 B2* | 2/2014 | Yang | ................... | H02M 3/3376 363/21.03 |
| 2005/0088158 A1* | 4/2005 | Horiguchi | ............... | G05F 3/242 323/282 |

FOREIGN PATENT DOCUMENTS

JP    2011-211512    10/2011

* cited by examiner

*Primary Examiner* — Yemane Mehari
(74) *Attorney, Agent, or Firm* — Volentine & Whitt, PLLC

(57) ABSTRACT

There is provided a semiconductor device including: a power source section that steps down a power source voltage to generate a step-down voltage, and that stops generation of the step-down voltage when input with a stop signal; a control section that is driven by the step-down voltage generated by the power source section, and that outputs to the power source section a stop signal to stop generation of the step-down voltage; and a power source controller that prohibits input of the stop signal to the power source section until the step-down voltage has become a predetermined value or greater.

6 Claims, 8 Drawing Sheets

SEMICONDUCTOR DEVICE AND POWER SOURCE CONTROL METHOD

CROSS-REFERENCE TO RELATED APPLICATION

This application claims priority under 35 USC 119 from Japanese Patent Application No. 2013-168675 filed on Aug. 14, 2013, the disclosure of which is incorporated by reference herein.

BACKGROUND

1. Technical Field

The present invention relates to a semiconductor device and a power source control method, and in particular relates to a semiconductor device and a power source control method well-suited to performing reliable startup control, for example, in a power source circuit provided in a Large Scale Integration (LSI).

2. Related Art

Semiconductor devices such as LSIs are provided with, for example, a power source circuit that generates a power source voltage VDDL that is lower than an externally input power source voltage VDD, and a control circuit (also referred to below as an LSI control circuit) that uses the voltage VDDL generated by the power source circuit to control respective circuit operations within the semiconductor device. The LSI control circuit enables a reduction in power consumption due to controlling the respective circuit operations using the voltage VDDL that is lower than the voltage VDD.

Semiconductor devices configured in this manner generally include a power down mode in which circuits are paused under specific conditions, with the aim of further reducing power consumption. For example, control is made such that when there is a drop in the battery voltage of a secondary battery that is the power source of the electronic circuits mounted on the semiconductor device, the power source circuit transitions to the power down mode, output of the power source voltage is shut off, and current consumption of the electronic circuits is suppressed to a minimum until the voltage of the rechargeable battery has recovered. Then, once the battery voltage has recovered due to, for example, recharging the rechargeable battery, control is made to restore the power source circuit from the power down mode and allow supply of the power source voltage VDDL to return the electronic circuits to a normal operating state.

However, when, for example as described in Japanese Patent Application Laid-Open (JP-A) No. 2011-211512, output of an internal power source voltage is stopped and started during transition to a power down mode, or recovery from the power down mode, various faults can occur in which unstable operation of the electrical circuit, different from normal operation, occurs during this switching.

JP-A No. 2011-211512 describes technology in which output of an abnormal signal from a level shifter occurring during transition to the power down mode is eliminated by interrupting an internal power source voltage using a short circuit control signal of a startup signal for controlling the power down mode imparted with a specific delay.

The present invention addresses the point in related technology, including that of JP-A No. 2011-211512, of being unable to avoid faults in which the power source circuit does not start up correctly in configurations in which a power down signal, output from an LSI control circuit that uses the output voltage (VDDL) from the power source circuit as a power source, is input to a power down terminal of the power source circuit.

Namely, in related semiconductor devices provided with a power down mode, the power source circuit itself is provided with a power down function in order to enable external application of the voltage VDDL, and eliminate impact on the power source circuit, when testing characteristics such as, for example, dependency on power source voltage of an LSI control circuit using a voltage VDDL generated by the power source circuit.

Such power source circuits are provided with a terminal (also referred to below as a power down terminal) that is input with an externally input power down signal. The power down signal is output from the LSI control circuit and input to the power down terminal of the power source circuit.

However, there is a risk of the power source circuit starting up incorrectly in such a configuration, in which the power source circuit is provided with a power down function and the power down signal is output from the LSI control circuit that uses the output voltage (VDDL) as the power source and input to the power down terminal of the power source circuit.

For example, when the power source is introduced, the power source circuit does not generate the voltage VDDL (VDDL=0V). When this is the case, the power down signal from the LSI control circuit is normally at a L (low) level that does not cause the power source circuit to power down.

However, the LSI control circuit has a minimum operating voltage. Until the VDDL rises to the minimum operating voltage, the LSI control circuit does not operate normally, and the power down signal from the LSI control circuit becomes indeterminate. There is accordingly a possibility of the power down signal from the LSI control circuit becoming H (high) and causing the power source circuit to power down.

In such power source circuits, technology also exists for causing the power source circuit to power down reliably by inputting a power down signal from the LSI control circuit to the power down terminal of the power source circuit through a level shift circuit that, similarly to the LSI control circuit, uses the output voltage (VDDL) from the power source circuit as a power source.

However, such a level shift circuit also has a minimum operating voltage. Until the voltage VDDL rises to the minimum operating voltage, the level shift circuit does not operate normally. In such configurations, there is moreover no guarantee of the level shift circuit operating normally even when VDDL=0V. For example, when the power source is introduced the power down signal from the level shift circuit is not necessarily L (low) level even when the power down signal from the LSI control circuit is L (low) level, and is sometimes H (high) level. In such cases, the level shift circuit powers down.

Moreover, even when the power down signal from the level shift circuit is at the L (low) level when the power source is introduced, there is a possibility of the power down signal from the level shift circuit becoming H (high) with the subsequent rise in the voltage VDDL, and the power source circuit powering down.

SUMMARY

In consideration of the above circumstances, an object of the present invention is to provide technology capable of starting up a power source circuit reliably in a configuration in which an LSI control circuit, that uses an output voltage from a power source circuit as a power source, outputs a power down signal that is input to a power down terminal of the power source circuit.

A first aspect of the present invention is a semiconductor device including a power source section that steps down a power source voltage to generate a step-down voltage and that stops generation of the step-down voltage when input with a stop signal, a control section that is driven by the step-down voltage generated by the power source section and that outputs to the power source section a stop signal to stop generation of the step-down voltage, and a power source controller that prohibits input of the stop signal to the power source section until the step-down voltage has become a predetermined value or greater.

A second aspect of the present invention is a power source control method including, by a power source section, stepping down a power source voltage to generate a step-down voltage and stopping generation of the step-down voltage when input with a stop signal, by a control section that is driven by the step-down voltage generated by the power source section, outputting to the power source section a stop signal to stop generation of the step-down voltage, and, by a power source controller, prohibiting input of the stop signal to the power source section until the step-down voltage has become a predetermined value or greater.

In the present invention, the power source section steps down the power source voltage to generate the step-down voltage, and stops generation of the step-down voltage when input with the stop signal. The control section that is driven by the step-down voltage generated by the control section outputs the stop signal to stop generation of the step-down voltage, and the power source controller prohibits input of the stop signal to the power source controller until the step-down voltage has become the predetermined value or greater. Accordingly, the step-down voltage output from the power source section can avert abnormal operation stoppage of the power source section during an unstable period until normal operation of the control section.

According to the present invention, it is possible to avert operation stoppage of the power source section due to the stop signal from the control section during an unstable period from the start of voltage VDDL generation by the power source section until the start of normal operation of the control section. Correct startup of the power source section can accordingly be reliably performed in the semiconductor device that is configured such that the control section outputs the stop signal to stop operation of the power source section.

BRIEF DESCRIPTION OF THE DRAWINGS

Exemplary embodiments of the present invention will be described in detail based on the following figures, wherein.

DETAILED DESCRIPTION

Explanation follows regarding an exemplary embodiment according to the present invention, with reference to the drawings. First, explanation is given regarding a semiconductor device employed for comparison with a semiconductor device according to the present invention, with reference to FIG. 11.

Figure 11:
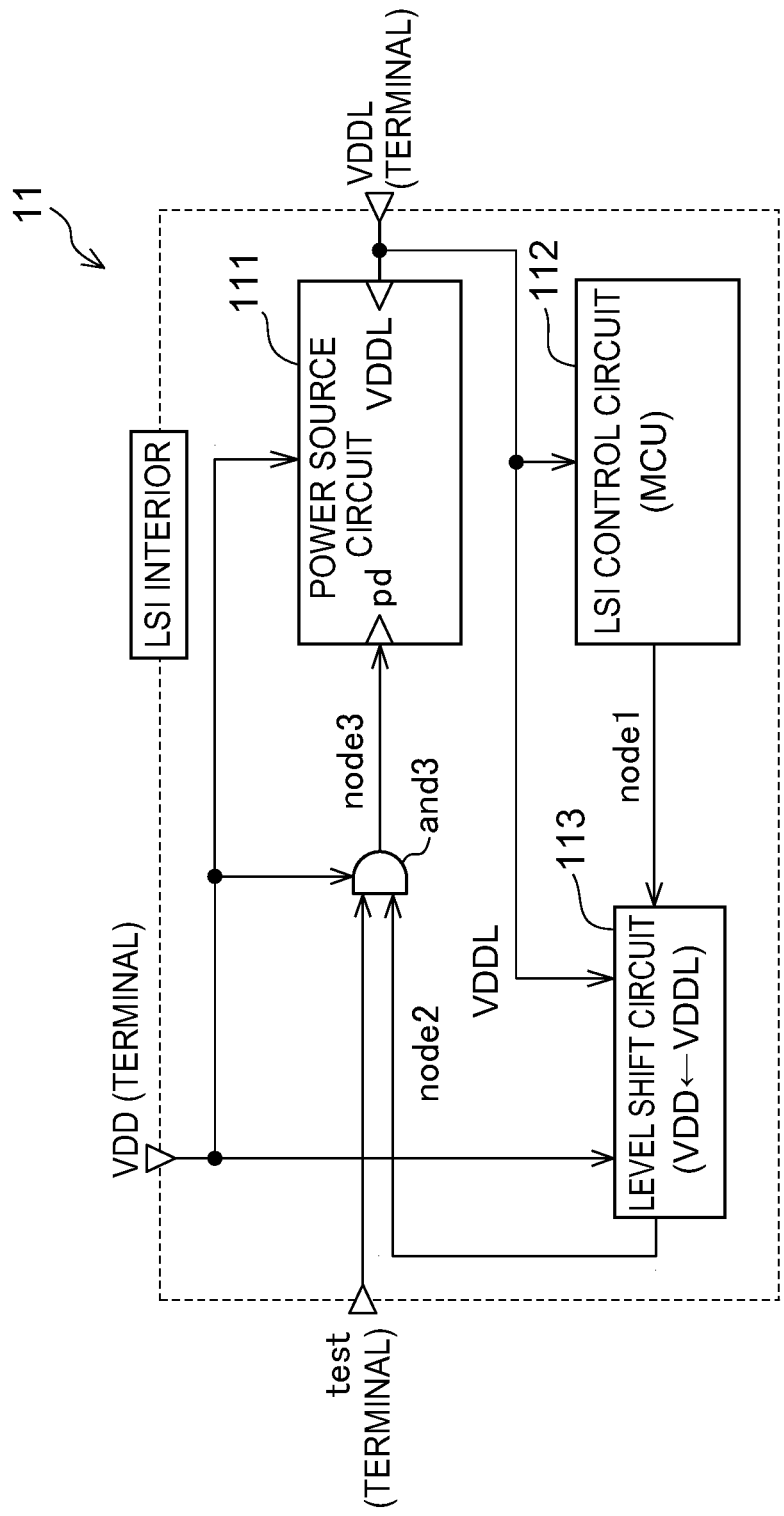
FIG. 11 is a circuit diagram illustrating a configuration example of a semiconductor device employed for comparison with a semiconductor device according to the present invention.

A semiconductor device 11, labeled "LSI interior" in FIG. 11, is configured by: a power source circuit 111 that uses a voltage VDD as a power source and that generates a voltage VDDL that is lower than the voltage VDD (VDDL<VDD); an LSI control circuit 112 serving as a semiconductor integrated circuit that uses as a power source the voltage VDDL generated by the power source circuit 111; a level shift circuit 113, that converts a voltage VDDL level signal node1, from the LSI control circuit 112 for powering down the power source circuit 111, to a voltage VDD level signal node2; and an AND circuit and3 that is input with a signal test from an external terminal and the signal node2 from the level shift circuit 113, and that outputs a signal node3. Note that the signal node3 is input to a power down terminal pd of the power source circuit 111.

The LSI control circuit 112 is a circuit that controls various circuit operations of the LSI interior (semiconductor device 11), and enables a reduction in power consumption of the semiconductor device 11 due to using the voltage VDDL generated by the power source circuit 111 as a power source.

The power source circuit 111 is provided with a power down function, and the power source circuit 111 is provided with the power down terminal pd input with the power down signal generated by the LSI control circuit 112. This enables the VDDL to be externally applied, and impact to the power source circuit 111 to be eliminated, for example, when testing power source voltage dependency characteristics of the LSI control circuit 112.

As described above under "Related Art", there is a risk of the power source circuit 111 not starting up correctly in configurations such as that of the semiconductor device 11 in which the power source circuit 111 is provided with a power down function, and in which a power down signal for executing the power down function is controlled based on predetermined conditions by the LSI control circuit 112 that uses the output voltage of the power source circuit 111 as its power source.

In order to avert such a risk, the semiconductor device 11 illustrated in FIG. 11 employs the signal test from the external terminal. Accordingly, even when the signal node2 is indeterminate prior to voltage VDDL generation, provided that the signal test from the external terminal is L (low), the AND circuit and3 that is input with the signal node2 and the signal test outputs a L (low) signal node3, and the power source circuit 111 starts up reliably.

However, in the circuit configuration illustrated in FIG. 11, the external terminal is required in order to input the signal test, thus affecting the LSI chip size and the placement of the external terminal. In particular, with increasing cost competition in semiconductor devices, LSI cost reduction is recently becoming an important issue, and there are demands to reduce chip size as far as possible.

Figure 1:
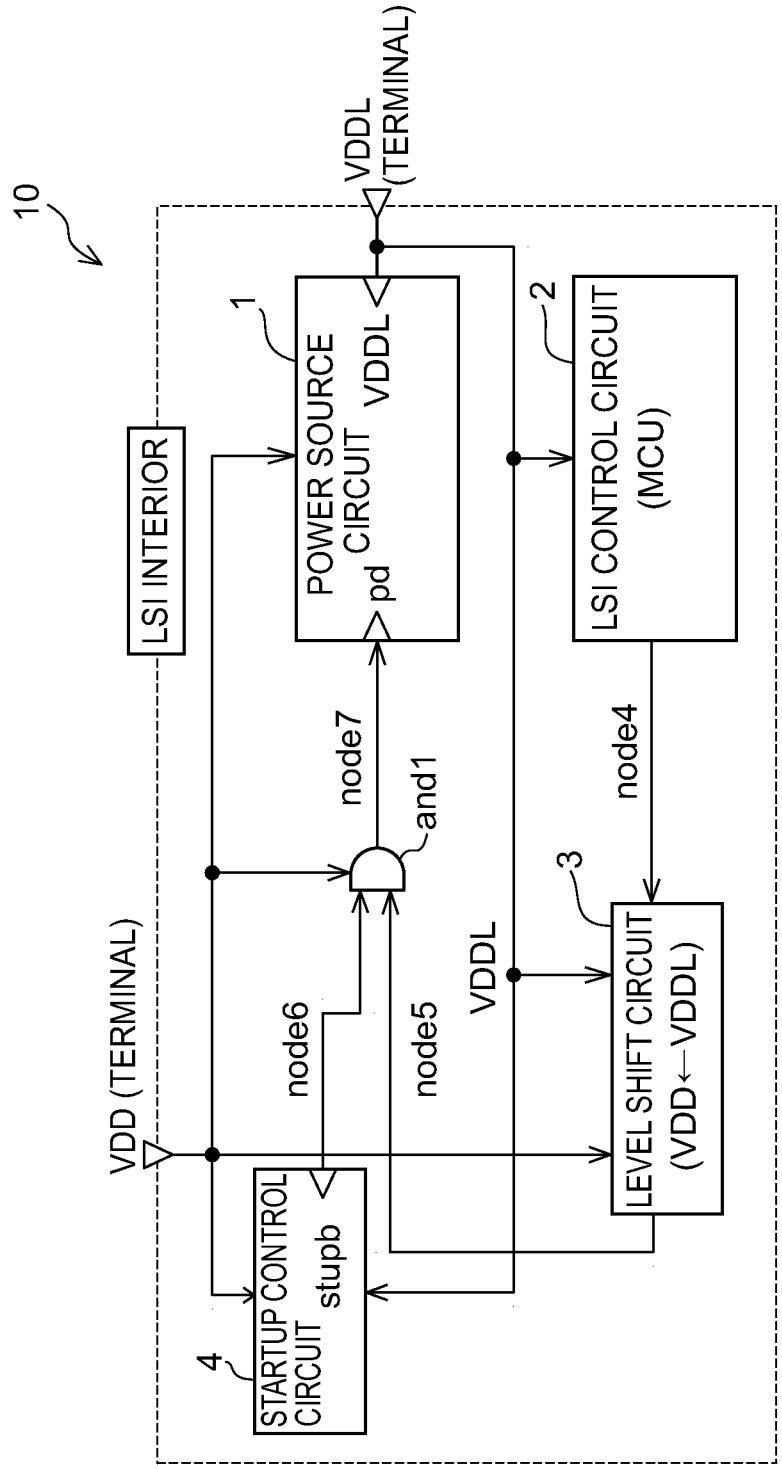
FIG. 1 is a circuit diagram illustrating a configuration example (first exemplary embodiment) of a semiconductor device according to the present invention.

FIG. 1 illustrates a semiconductor device configured so as to perform correct startup control of the power source circuit 111, with a configuration in which an external terminal signal test input has been dispensed with in order to accommodate such demands.

FIG. 1 illustrates an example of a first exemplary embodiment of a semiconductor device according to the present invention. A semiconductor device 10, labelled "LSI interior" in FIG. 1, is configured by: a power source circuit 1 serving as a power source section of the present invention, that uses a voltage VDD from an external terminal ("VDD terminal") as a power source and generates a voltage VDDL that is lower than the voltage VDD (corresponding to a step-down voltage of the present invention); an LSI control circuit 2 serving as a control section of the present invention, that is configured by a semiconductor integrated circuit and uses the voltage VDDL generated by the power source circuit 1 as a power source; a level shift circuit 3, serving as a step-up section of the present invention, that converts a voltage VDDL level signal node4, that is for powering down the power source circuit 1 and is generated in the LSI control circuit 2, into a voltage VDD level signal node5; a startup control circuit 4 that is input with the voltage VDD from the external terminal and the voltage VDDL generated by the power source circuit 1, and that generates a signal node6 that is input to a power down terminal pd of the power source circuit 1; and an AND circuit and1, that is input with the signal node6 from the startup control circuit 4 and the voltage VDD level signal node5 from the level shift circuit 3, and that outputs a signal node7 to the power down terminal pd of the power source circuit 1. Note that the startup control circuit 4 and the AND circuit and1 configure a power source controller according to the present invention. The LSI control circuit 2 is a Micro Control Unit, labelled "MCU" in the drawings.

Figure 2:
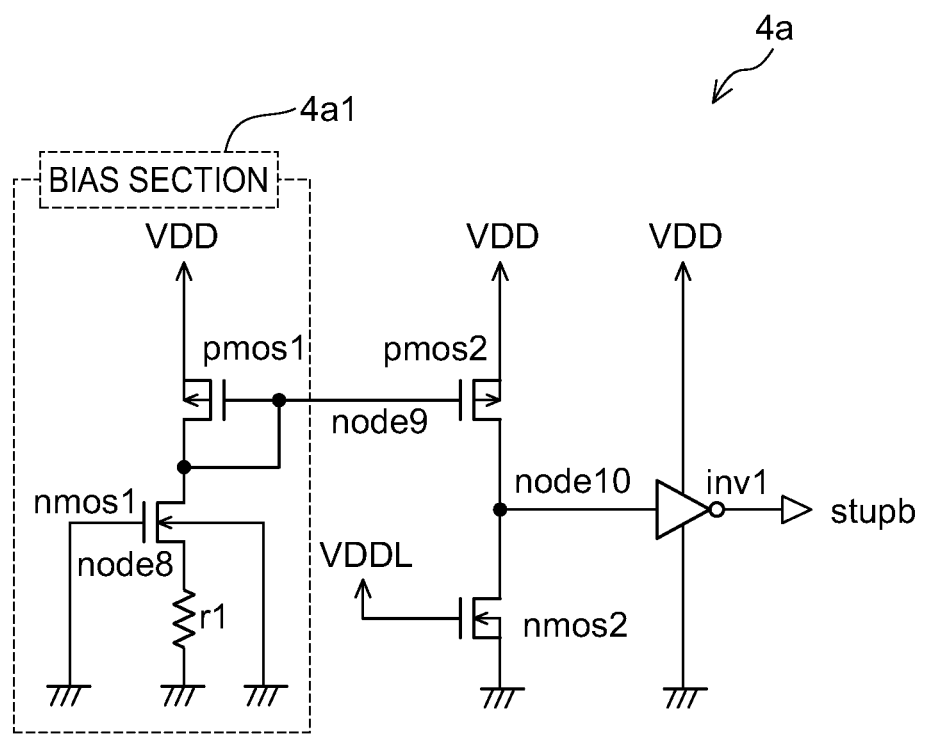
FIG. 2 is a circuit diagram illustrating a first configuration example of the startup control circuit illustrated in FIG. 1.

The startup control circuit 4 is a circuit that enables reliable startup of the power source circuit 1 by monitoring the voltage VDDL output from the power source circuit 1, and continuing to output a L (low) level signal node6 until the voltage VDDL exceeds a predetermined threshold value voltage. Detailed configuration thereof is illustrated in FIG. 2.

As illustrated by the startup control circuit 4a in FIG. 2, the startup control circuit is a circuit configured with: a resistor r1 between the source electrode of an N-channel MOS transistor nmos1 and ground (also referred to below as GND); the gate electrode and bulk electrode of the N-channel MOS transistor nmos1 connected to GND; the drain electrode of the N-channel MOS transistor nmos1, as well as the drain electrode and the gate electrode of a P-channel MOS transistor pmos1, connected to the gate electrode of a P-channel MOS transistor pmos2; the source electrode of the P-channel MOS transistor pmos1, as well as the source electrode and bulk electrode of the P-channel MOS transistor pmos2, connected to the VDD power source; the drain electrode of the P-channel MOS transistor pmos2, as well as the input of an inverter inv1 with a VDD power source, connected to the drain electrode of an N-channel MOS transistor nmos2; the source electrode and bulk electrode of the N-channel MOS transistor nmos2 connected to GND; and the gate electrode of the N-channel MOS transistor nmos2 connected to the VDDL power source.

Note that the N-channel MOS transistor nmos1 corresponds to a first N-channel MOS transistor of the present invention, the P-channel MOS transistor pmos1 corresponds to a first P-channel MOS transistor of the present invention, the P-channel MOS transistor pmos2 corresponds to a second P-channel MOS transistor of the present invention, and the N-channel MOS transistor nmos2 corresponds to a second N-channel MOS transistor of the present invention. The inverter inv1 corresponds to a logic inverting circuit of the present invention.

The N-channel MOS transistor nmos1, the P-channel MOS transistor pmos1 and the resistor r1 configure a bias section 4a1 that causes the P-channel MOS transistor pmos2 to operate as a constant current source.

The N-channel MOS transistor nmos1 employs a depression N-channel MOS transistor. With the gate electrode connected to GND, the N-channel MOS transistor nmos1 exhibits the characteristics illustrated by the solid line in FIG. 3, with a source electrode node8 voltage (node8 voltage) along the horizontal axis and a drain-source current (nmos and r1 current) along the vertical axis.

Figure 3:
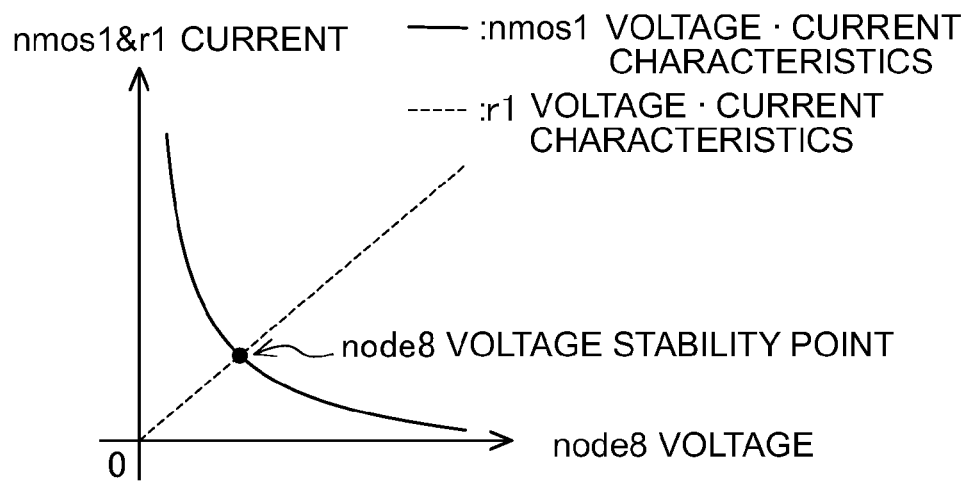
FIG. 3 is an explanatory diagram illustrating an example of operation characteristics of the NMOS illustrated in FIG. 2.

The resistor r1 exhibits the characteristics illustrated by the dashed line in FIG. 3, with the source electrode node8 voltage (node8 voltage) along the horizontal axis and the current flowing in the resistor r1 (nmos1 and r1 current) along the vertical axis.

In FIG. 3, there is only a single point of intersection between the solid line and the dashed line, so the voltage of the source electrode node8 in FIG. 2 is stable at the intersection point voltage.

When the source electrode node8 voltage becomes stable at the intersection point voltage, a constant current source in which an intersection point current flows is achieved. A gate electrode node9 of the P-channel MOS transistor pmos1 that is diode-connected can accordingly mirror the constant current by connecting to a P-channel MOS gate electrode of another circuit.

Namely, the gate electrode node9 of the P-channel MOS transistor pmos1 is connected to the gate electrode of the P-channel MOS transistor pmos2, and the P-channel MOS transistor pmos2 operates as a constant current source that mirrors the current of the P-channel MOS transistor pmos1.

Explanation follows regarding operation during startup of the power source circuit 1 illustrated in FIG. 1, employing the startup control circuit 4a configured as described above. First, a state is considered in which the voltage VDD is supplied from the outset, with voltage VDDL=0V. In FIG. 2, the P-channel MOS transistor pmos2 operates as the current source since the voltage VDD is supplied.

The voltage VDDL=0V, and the N-channel MOS transistor nmos2 is in an OFF state. In such cases, there is accordingly a high (H) level signal node10 at the connection point between the drain electrode of the N-channel MOS transistor nmos2 and the drain electrode of the P-channel MOS transistor pmos2, and the signal from the inverter inv1 that is input with the signal node10 (H), namely the output signal from a terminal stupb, becomes low (L) level.

The signal node6 output from the startup control circuit 4 illustrated in FIG. 1 is therefore low (L), and the signal node7 output from the AND circuit and1 is low (L) regardless of the signal nodes4, 5 output from the LSI control circuit 2 and the level shift circuit 3 respectively. As a result, the power source circuit 1 continues to start up reliably without powering down, and the voltage VDDL output from the power source circuit 1 begins to rise.

When the voltage VDDL thus rises, the N-channel MOS transistor nmos2 illustrated in FIG. 2 gradually begins to become ON. When the voltage VDDL becomes equal to or greater than a threshold value voltage Vt of the N-channel MOS transistor nmos2, the voltage at a connection point between the drain electrode of the N-channel MOS transistor nmos2 and the drain electrode of the P-channel MOS transistor pmos2 begins to drop. When the signal node10 drops to a low (L) level beyond a threshold value of the inverter inv1, the signal from the inverter inv1, namely the output signal of the terminal stupb, becomes high (H) level, and the signal node6 output from the startup control circuit 4 illustrated in FIG. 1 becomes high (H).

Namely, when the voltage VDDL becomes equal to or greater than the threshold value voltage Vt of the N-channel MOS transistor nmos2, the output signal from the inverter inv1 (the signal from the terminal stupb) becomes high (H) level. When this occurs, the output signal node5 from the level shift circuit 3 can be established as low (L), as long as the voltage VDDL allows normal operation of the level shift circuit 3 and the LSI control circuit 2 of FIG. 1. The output signal node7 from the AND circuit and1 accordingly becomes low (L), regardless of the output signal from the inverter inv1, and the power source circuit 1 does not power down.

In the semiconductor device 10 of the example of the first exemplary embodiment illustrated in FIG. 1 to FIG. 3, the voltage VDDL generated by the power source circuit 1 can continue to operate the power source circuit 1 until reaching the threshold value voltage Vt of the N-channel MOS transistor nmos2 or greater. Accordingly, the semiconductor device 10 of the example of the first exemplary embodiment enables correct startup of the power source circuit 1 to be performed reliably, without employing the external terminal (for signal test input) illustrated in FIG. 11. Moreover, the configuration of the example of the first exemplary embodiment does not require an external terminal, enabling a reduction in chip size of the semiconductor device 10.

Figure 4:
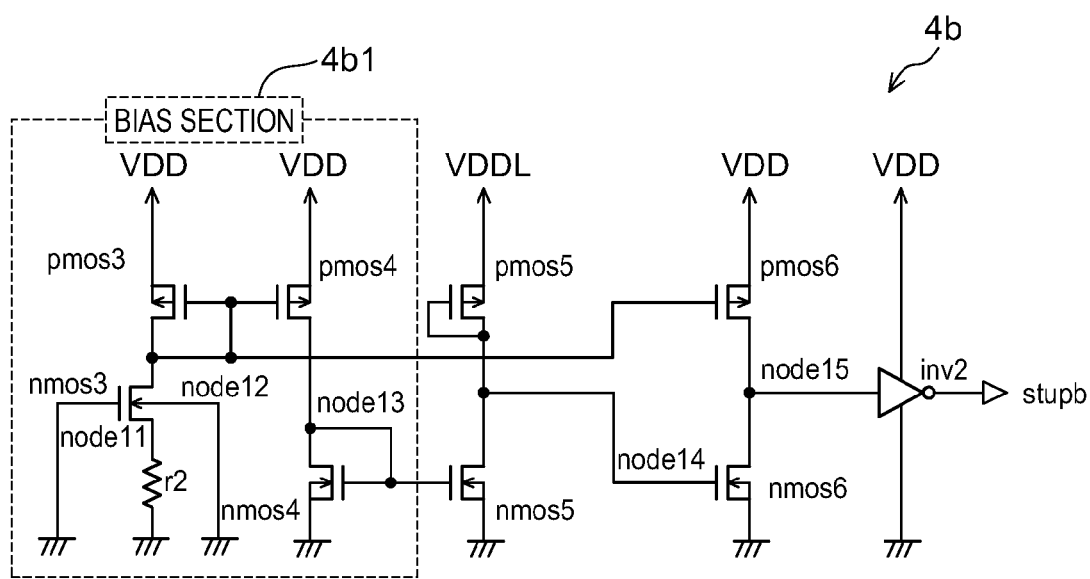
FIG. 4 is a circuit diagram illustrating a second configuration example of the startup control circuit illustrated in FIG. 1.

Next, explanation follows regarding another configuration example of the startup control circuit 4 illustrated in FIG. 1, with reference to FIG. 4. In the startup control circuit 4b illustrated in FIG. 4, a resistor r2 is connected between the source electrode of an N-channel MOS transistor nmos3 and GND.

Moreover, the respective source electrodes and bulk electrodes of an N-channel MOS transistor nmos4, an N-channel MOS transistor nmos5, and an N-channel MOS transistor nmos6 are each connected to GND.

The respective source electrodes and bulk electrodes of a P-channel MOS transistor pmos3, a P-channel MOS transistor pmos4 and a P-channel MOS transistor pmos6 are each connected to the voltage VDD.

The source electrode and bulk electrode of a P-channel MOS transistor pmos5 are connected to the voltage VDDL, and the gate electrode and the bulk electrode of the N-channel MOS transistor nmos3 are connected to GND.

The drain electrode of the N-channel MOS transistor nmos3 is connected to the drain electrode and the gate electrode of the P-channel MOS transistor pmos3, and also to the gate electrodes of the P-channel MOS transistors pmos4 and pmos6.

The drain electrode of the P-channel MOS transistor pmos4 is connected to the drain electrode and the gate electrode of the N-channel MOS transistor nmos4, and also to the gate electrode of the N-channel MOS transistor nmos5.

The drain electrode of the N-channel MOS transistor nmos5 is connected to the drain electrode and the gate electrode of the P-channel MOS transistor pmos5, and also to the gate electrode of the N-channel MOS transistor nmos6.

The drain electrode of the P-channel MOS transistor pmos6 is connected to the input of an inverter inv2 that uses the voltage VDD as a power source, and also to the drain electrode of the N-channel MOS transistor nmos6.

Note that the N-channel MOS transistor nmos3 corresponds to a third N-channel MOS transistor of the present invention, and the P-channel MOS transistor pmos3 corresponds to a third P-channel MOS transistor of the present invention. The P-channel MOS transistor pmos4 corresponds to a fourth P-channel MOS transistor of the present invention, and the N-channel MOS transistor nmos4 corresponds to a fourth N-channel MOS transistor of the present invention. The N-channel MOS transistor nmos5 corresponds to a fifth N-channel MOS transistor of the present invention, the P-channel MOS transistor pmos5 corresponds to a fifth P-channel MOS transistor of the present invention, the P-channel MOS transistor pmos6 corresponds to a sixth P-channel MOS transistor of the present invention, and the N-channel MOS transistor nmos6 corresponds to a sixth N-channel MOS transistor of the present invention.

The N-channel MOS transistor nmos3, the P-channel MOS transistor pmos3, and the resistor r2 configure a bias section 4b1 that enables the P-channel MOS transistor pmos6 to operate as a constant current source, in a similar manner to the N-channel MOS transistor nmos1, the P-channel MOS transistor pmos1, and the resistor r1 explained with reference to FIG. 2.

The P-channel MOS transistor pmos4 and the N-channel MOS transistor nmos4 configure a current mirror circuit to enable the N-channel MOS transistor nmos5 to operate as a constant current source, mirroring the constant current flowing in the P-channel MOS transistor pmos3.

The gate electrode of the P-channel MOS transistor pmos6 is connected to a connection point of the drain electrode of the N-channel MOS transistor nmos3, the drain electrode and the gate electrode of the P-channel MOS transistor pmos3, and the gate electrode of the P-channel MOS transistor pmos4. The P-channel MOS transistor pmos6 operates as a constant current source that mirrors the current of the P-channel MOS transistor pmos3, and the gate electrode of the P-channel MOS transistor pmos6 is moreover input with a signal node12 of the connection point.

The drain electrode and the gate electrode of the N-channel MOS transistor nmos4 are connected to the gate electrode of the N-channel MOS transistor nmos5. The N-channel MOS transistor nmos5 operates as a constant current source that mirrors the current of the N-channel MOS transistor nmos4, and the gate electrode of the N-channel MOS transistor nmos5 is moreover input with a signal node13 of the connection point.

Explanation follows regarding operation during startup of the power source circuit 1 of FIG. 1, using the above configuration. A state is considered in which the voltage VDD is supplied from the outset, and the voltage VDDL is 0V.

Due to the voltage VDD supply, the N-channel MOS transistor nmos5 and the P-channel MOS transistor pmos6 operate as constant current sources.

The voltage VDDL is 0V, a signal node14 input to the gate electrode of the N-channel MOS transistor nmos6 is low (L) level, and the N-channel MOS transistor nmos6 is in an OFF state.

In such cases, a signal node15 input to the inverter inv2 is high (H) level, and the output signal of the inverter inv2 (signal from the terminal stupb) is low (L) level. As a result, the output signal node6 of the startup control circuit 4 in FIG. 1 is low (L) level. The output signal node7 from the AND circuit and1 is accordingly low (L) regardless of the state of the output signal node5 from the level shift circuit 3, and the voltage VDDL from the power source circuit 1 begins to rise without the power source circuit 1 powering down.

When the voltage VDDL thus rises, the voltage of the signal node14 illustrated in FIG. 4 also rises. However, the P-channel MOS transistor pmos5 is a diode-connected transistor while the N-channel MOS transistor nmos5 moreover operates as a constant current source, such that the voltage of the signal node14 is a voltage of the voltage VDDL reduced by the threshold value voltage Vt of the P-channel MOS transistor pmos5.

When the voltage of the signal node14 rises, the N-channel MOS transistor nmos6 gradually begins to turn ON, and when the voltage of the signal node14 reaches the threshold value voltage Vt of the P-channel MOS transistor pmos6 or greater, the voltage of the signal node15 begins to drop. When the voltage of the signal node15 has dropped beyond a threshold value of the inverter inv2 to the low (L) level, the output signal of the inverter inv2 (output signal from the terminal stupb) becomes high (H) level, and the signal node6 from the startup control circuit 4 in FIG. 1 becomes high (H).

Namely, when the voltage VDDL output from the power source circuit 1 reaches or exceeds the sum of the threshold value voltage Vt of the P-channel MOS transistor pmos5 and the threshold value voltage Vt of the N-channel MOS transistor nmos6, the output signal of the inverter inv2 (the output signal from the terminal stupb) becomes high (H) level, and the output signal node6 from the startup control circuit 4 in FIG. 1 becomes high (H).

The startup control circuit 4b configured as illustrated in FIG. 4 includes the P-channel MOS transistor pmos4, the P-channel MOS transistor pmos5, the N-channel MOS transistor nmos4, and the N-channel MOS transistor nmos5 in addition to the startup control circuit 4a of the configuration illustrated in FIG. 2. As a result, the power source circuit 1 can continue to operate until the voltage VDDL output from the power source circuit 1 reaches or exceeds the sum of the threshold value voltage of the P-channel MOS transistor pmos5 and the threshold value voltage of the N-channel MOS transistor nmos6, thus exhibiting the advantageous effect of raising the threshold value voltage.

The present exemplary embodiment thus enables the power source circuit 1 to continue to be operated up to a higher voltage than with the startup control circuit 4a illustrated in FIG. 2, and also enables correct startup of the power source circuit 1 to be performed reliably without employing an external terminal for inputting the testing signal test, as illustrated in FIG. 11.

Figure 5:
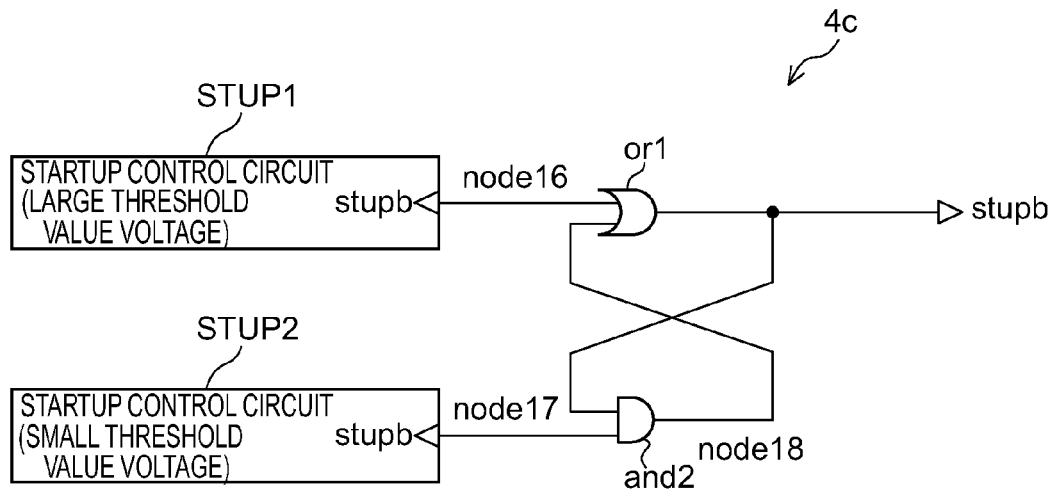
FIG. 5 is a circuit diagram illustrating a configuration example (second exemplary embodiment) of a semiconductor device according to the present invention.
Figure 6:
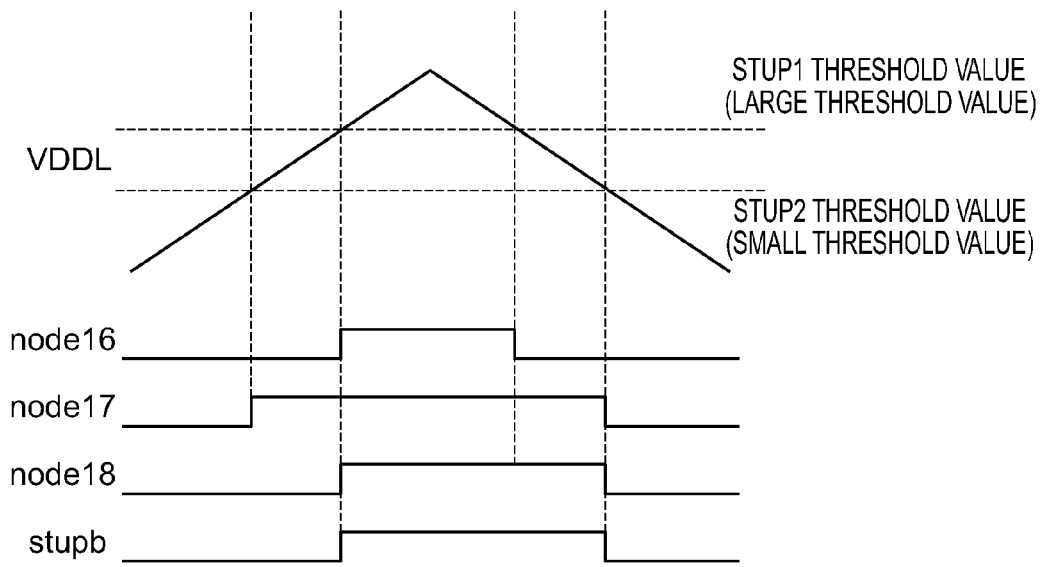
FIG. 6 is a timing chart illustrating an example of operation of the startup control circuit illustrated in FIG. 5.

Explanation follows regarding another configuration example of the startup control circuit 4 illustrated in FIG. 1, with reference to FIG. 5 and FIG. 6. A startup control circuit 4c illustrated in FIG. 5 is equipped with two startup control circuits STUP1, STUP2, and with an OR circuit or1 and an AND circuit and2.

A signal node16 output from the startup control circuit STUP1 is input to one input terminal of the OR circuit or1, and a signal node17 output from the startup control circuit STUP2 is input to one input terminal of the AND circuit and2.

Connection is made such that the output of the OR circuit or1 is input to the other input terminal of the AND circuit and2, and the output of the AND circuit and2 is input to the other input terminal of the OR circuit or1.

In the present example, the threshold value voltage of the startup control circuit STUP1 is greater than the threshold value voltage of the startup control circuit STUP2.

Explanation follows with reference to FIG. 6 regarding operation during startup of the power source circuit 1 illustrated in FIG. 1, employing the startup control circuit 4c configured as described above. A state is considered in which the voltage VDD is supplied from the outset, and the voltage VDDL is 0V.

The voltage VDDL is 0V, and the respective output signal nodes 16, 17 of the startup control circuit STUP1 and the startup control circuit STUP2 are both low (L) level. An output signal node18 of the AND circuit and2 is low (L), and the output signal of the OR circuit or1 (output signal from the terminal stupb) is low (L) level. The power source circuit 1 of FIG. 1 accordingly starts up, and the voltage VDDL begins to rise.

As the voltage VDDL thus rises, when the voltage VDDL enters a range in which "startup control circuit STUP1 threshold value voltage>VDDL≥startup control circuit STUP2 threshold value voltage", the output signal node16 of the startup control circuit STUP1 remains at a low (L) level, and the output signal node17 of the startup control circuit STUP2 transitions from a low (L) signal level to a high (H) signal level. However, the output signal node18 of the AND circuit and2 is at the low (L) level, and the output signal from the OR circuit or1 (output signal from the terminal stupb) also remains low (L) level.

As the voltage VDDL rises further from this state, when the voltage VDDL enters a range in which "VDDL>startup control circuit STUP1 threshold value voltage", the output signal node16 of the startup control circuit STUP1 transitions from low to high (L→H), the output signal node17 of the startup control circuit STUP2 remains high (H), and the output signal of the OR circuit or1 (output signal from the terminal stupb) and the output signal node18 from the AND circuit and2 transition from low to high (L→H). The output signal node6 from the startup control circuit 4 illustrated in FIG. 1 therefore becomes high (H).

Next, explanation follows regarding a case in which the voltage VDDL drops from the state in which "VDDL>startup control circuit STUP1 threshold value voltage".

In the "VDDL>startup control circuit STUP1 threshold value voltage" state of the voltage VDDL, the signal node16 output from the startup control circuit STUP1 and the signal node17 output from the startup control circuit STUP2 are high (H), and the output signal of the OR circuit or1 (output signal from the terminal stupb) and the output signal node18 of the AND circuit and2 are also high (L→H).

As the voltage VDDL begins to drop, when the voltage VDDL enters a range in which "startup control circuit STUP1 threshold value voltage≥VDDL>startup control circuit STUP2 threshold value voltage", the output signal node16 of the startup control circuit STUP1 transitions from high to low (H→L), and the output signal node17 of the startup control circuit STUP2 remains high (H). However, the output signal of the OR circuit or1 (the output signal of the terminal stupb) and the output signal node18 of the AND circuit and2 remain high (H).

As the voltage VDDL drops further from this state, when the voltage VDDL enters a range in which "startup control circuit STUP2 threshold value voltage≥VDDL", the output signal node16 of the startup control circuit STUP1 remains low (L), the output signal node17 of the startup control circuit STUP2 transitions from high to low (H→L), and the output signal of the OR circuit or1 (the output signal of the terminal stupb) and the output signal node18 of the AND circuit and2 transition from high to low (H→L). The output signal node6 from the startup control circuit 4 illustrated in FIG. 1 accordingly becomes low (L).

As the voltage VDDL rises in the startup control circuit 4c, the output signal of the OR circuit or1 (the output signal from the terminal stupb) transitions from low to high (L→H) at the startup control circuit STUP1 threshold value voltage, and as the voltage VDDL drops, the output signal of the OR circuit or1 (the output signal from the terminal stupb) transitions from high to low (H→L) at the startup control circuit STUP2 threshold value voltage.

The startup control circuit 4c illustrated in FIG. 5 can accordingly configure a startup control circuit with a high threshold value voltage when the voltage VDDL is rising, and a low threshold value voltage when the voltage VDDL is dropping, by combining the two respective startup control circuits with different threshold value voltages, namely, the startup control circuits 4a, 4b illustrated in FIG. 2 and FIG. 4, with the logic circuits of the OR circuit or1 and the AND circuit and2.

The present exemplary embodiment enables reliable startup of the power source circuit 1 until the voltage VDDL reaches a high voltage during startup, and during testing after startup, the power source circuit 1 can be powered down until the voltage VDDL reaches a low voltage. During testing, a lower voltage can be externally applied to the VDDL terminal illustrated in FIG. 1.

Accordingly, a low voltage operation margin can be secured for circuits driven at the voltage VDDL during testing by setting the threshold value voltage of the startup control circuit STUP1 to a voltage at which circuits driven by the voltage VDDL function reliably, and setting the startup control circuit STUP2 threshold value voltage to as low a voltage as possible.

Note that each of the startup control circuits of the semiconductor device according to the present invention explained with reference to FIG. 1 to FIG. 6 are applied as startup control circuits for a power source circuit, however the startup control circuits may be employed in other circuits by changing the origin of the voltage VDDL.

Figure 7:
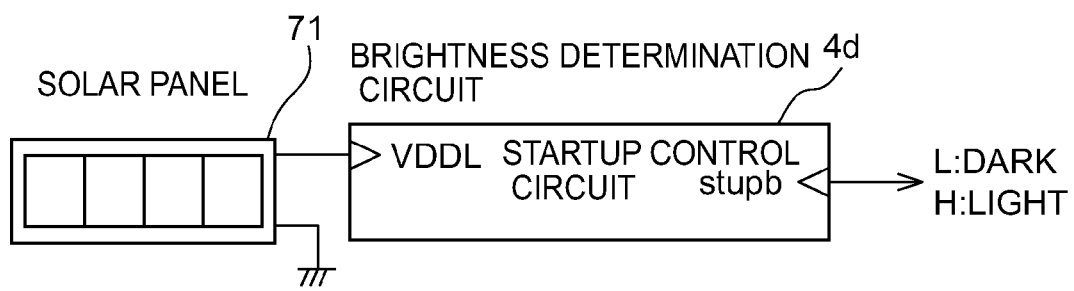
FIG. 7 is a block diagram illustrating a configuration example of a brightness determination device of a solar panel employing a semiconductor device according to the present invention.

For example, as illustrated in FIG. 7, a startup control circuit may be made to function as a brightness determination circuit 4d that determines the magnitude of a solar panel 71 output (brightness) by swapping the voltage VDDL for a voltage generated by the solar panel 71, that is a solar cell panel.

Figure 8:
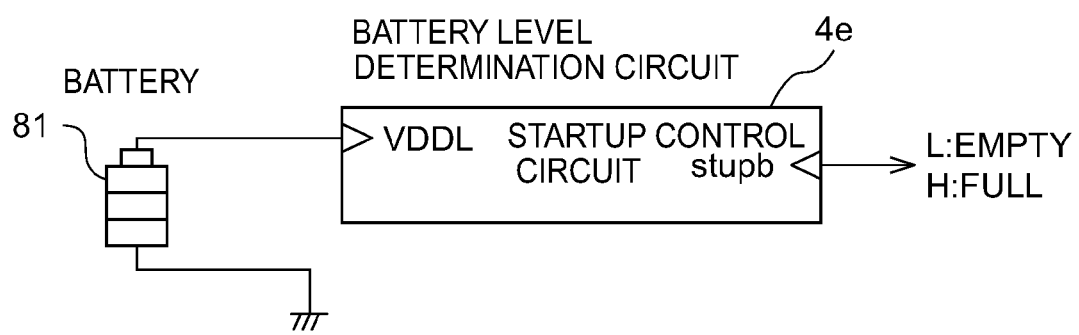
FIG. 8 is a block diagram illustrating a configuration example of a battery level determination device employing a semiconductor device according to the present invention.

Moreover, as illustrated in FIG. 8, a startup control circuit may be made to function as a battery level determination circuit 4e for determining binary battery levels (L: EMPTY, H: FULL) of a battery 81 by swapping the voltage VDDL for an output voltage of the battery 81, that is a battery cell.

Namely, a startup control circuit may be employed as a circuit that determines a magnitude of a specific voltage (VDDL) using a threshold value voltage as a reference.

Note that a power source controller according to the present invention configured from the startup control circuit 4 and the AND circuit and1 provided to the semiconductor device 10 illustrated in FIG. 1 is configured in the following manner when employed as a circuit that determines, using a threshold value as a reference, the magnitude of the specific voltage (VDDL) generated by a solar cell panel or a battery cell, as illustrated in FIG. 7 and FIG. 8. In a power supply controller, a stop signal node5 generated by the LSI control circuit 2 and increased by the level shift circuit 3 is switched to direct input to a power source circuit 1 when a step-down voltage (VDDL) that the power source circuit 1 has begun to generate reaches a predetermined value or greater. Moreover, a voltage is input from a power source section, such as a solar cell panel or a battery cell, and a signal, that indicates whether or not the input voltage is the predetermined value or greater, is generated and output.

As explained above with reference to the respective drawings, in the semiconductor device of the present exemplary embodiment, the power source circuit 1 generates the voltage VDDL (step-down voltage) as a stepped-down power source voltage VDD as a power source control method. The semiconductor device of the present exemplary embodiment stops generation of the step-down voltage when input with a stop signal. On satisfaction of predetermined conditions, the LSI control circuit 2 that is driven by the voltage VDDL generated by the power source circuit 1 generates and outputs a power down signal node4 (stop signal) to stop generation of the voltage VDDL by the power source circuit 1, and the startup control circuit 4 configuring a power source controller according to the present invention inputs a power down signal node7 output from the LSI control circuit 2 to the power source circuit 1 through the level shift circuit 3. Input of the power down signal node7 to the power source circuit 1 is prohibited from the start of voltage VDDL generation by the power source circuit 1 until the voltage VDDL reaches the predetermined value or greater. Accordingly, the voltage VDDL output from the power source circuit 1 can avert abnormal operation stoppage of the power source circuit 1 due to the power down signal node4 output from the LSI control circuit 2 during an unstable period until normal operation of the LSI control circuit 2.

Accordingly, in the present exemplary embodiment, it is possible to avert stoppage of the power source circuit 1 due to a stop signal from the LSI control circuit 2 during the unstable period from the start of voltage VDDL generation by the power source circuit 1 until the start of normal operation of the LSI control circuit 2. Correct startup of the power source circuit 1 can accordingly be reliably performed in the semiconductor device 10 that is configured such that the LSI control circuit 2, that uses as its power source the output voltage of the power source circuit 1, outputs a stop signal (power down signal node4) to stop operation of the power source circuit 1.

Note that the present invention is not limited to the exemplary embodiment explained with respect to the respective drawings, and various modifications are possible within a range that does not depart from the spirit of the present invention. For example, the bias sections 4a1, 4b1 respectively illustrated in FIG. 2 and FIG. 4 may be omitted in cases in which a bias voltage can be externally supplied.

Figure 9:
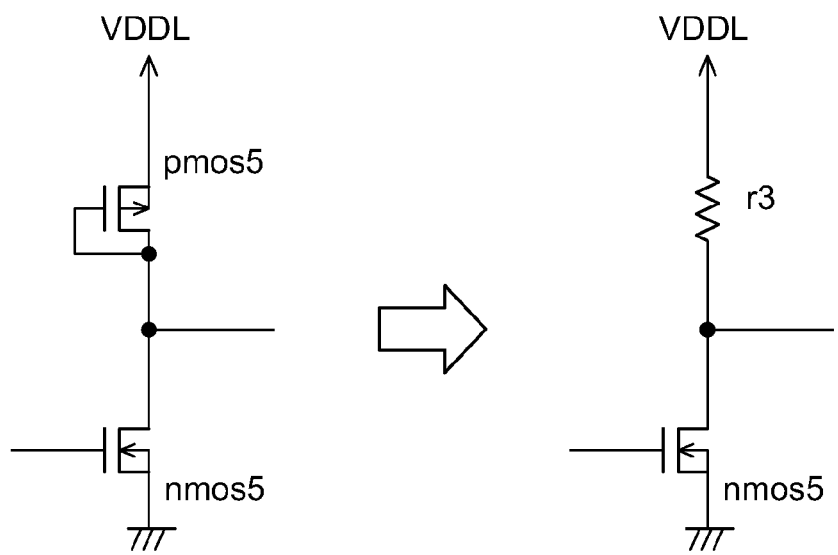
FIG. 9 is a circuit diagram illustrating a first alternative example of the PMOS5 configuring the startup control circuit illustrated in FIG. 4.
Figure 10:
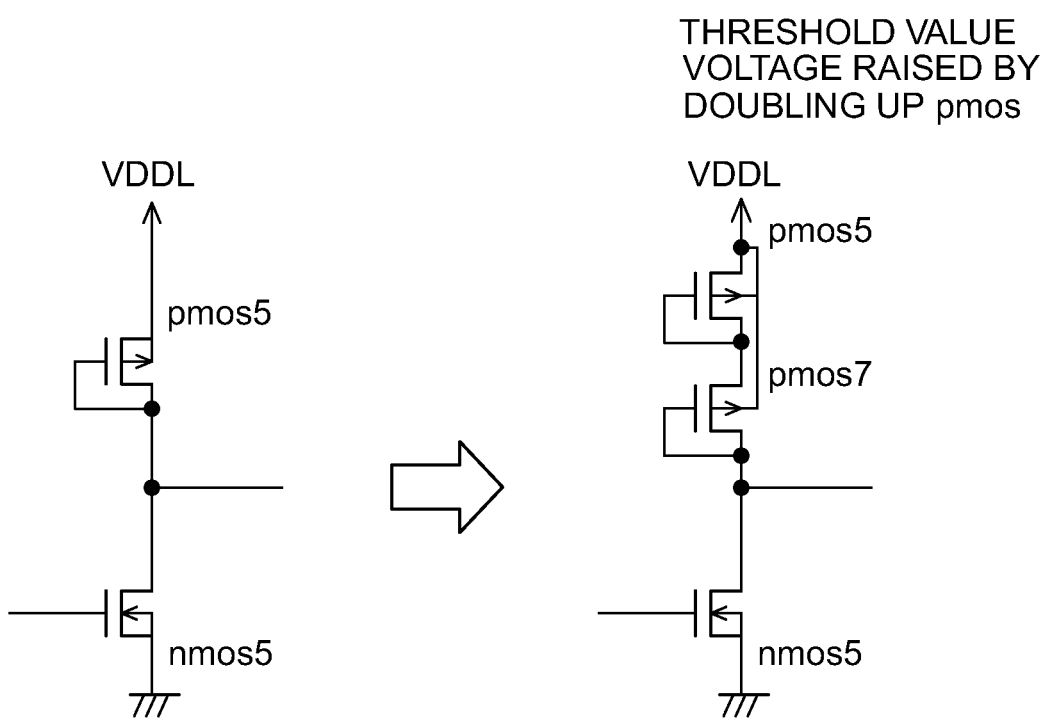
FIG. 10 is a circuit diagram illustrating a second alternative example of the PMOS5 configuring the startup control circuit illustrated in FIG. 4.

The P-channel MOS transistor pmos5 of the startup control circuit 4b illustrated in FIG. 4 may be substituted for a resistor r3 as illustrated in FIG. 9, or may be doubled up with a P-channel MOS transistor pmos7 to raise the threshold value voltage, as illustrated in FIG. 10. Note that the P-channel MOS transistor pmos7 corresponds to a seventh P-channel MOS transistor of the present invention.

In the semiconductor device 10 illustrated in FIG. 1, the power source controller of the present invention is configured by the startup control circuit 4 and the AND circuit and1. However, the power source controller of the present invention may be configured by the level shift circuit 3, the startup control circuit 4, and the AND circuit and1. Moreover, configuration may be made in which the level shift circuit 3 is provided inside the power source circuit 1.

What is claimed is:

1. A semiconductor device comprising:
    a power source section configured to step down a power source voltage to generate a step-down voltage, and to stop generation of the step-down voltage responsive to input of a stop signal;
    a control section configured to be driven by the step-down voltage generated by the power source section, and to output the stop signal to the power source section to stop generation of the step-down voltage; and
    a power source controller configured to prohibit input of the stop signal to the power source section until the step-down voltage becomes a predetermined value or greater,
    wherein the power source controller comprises
    a first N-channel MOS transistor having a gate electrode, a source electrode, and a bulk electrode connected to a ground voltage,
    a first P-channel MOS transistor having a source electrode and a bulk electrode connected to the power source voltage, and a gate electrode and a drain electrode connected to a drain electrode of the first N-channel MOS transistor,
    a second P-channel MOS transistor having a source electrode and a bulk electrode connected to the power source voltage, and a gate electrode connected to the gate electrode of the first P-channel MOS transistor,
    a second N-channel MOS transistor having a source electrode connected to the ground voltage, a gate electrode connected to the step-down voltage, and a drain electrode connected to a drain electrode of the second P-channel MOS transistor, and that is configured to switch ON when the step-down voltage becomes the predetermined value or greater to place a drain electrode potential of the second P-channel MOS transistor at a low level,
    a logic inverting circuit that is driven by the power source voltage, that has an input terminal connected to the drain electrode of the second N-channel MOS transistor and the drain electrode of the second P-channel MOS transistor, and that is configured to invert a signal input at the input terminal to provide an output signal, and
    an AND circuit configured to perform an AND computation of the output signal from the logic inverting circuit and the stop signal.

2. The semiconductor device of claim 1, further comprising:
    a step-up section configured to step up the stop signal output from the control section to a voltage level of the power source voltage, and to output the stop signal to the power source controller,
    wherein the power source section is configured to stop generation of the step-down voltage when input with the stepped up stop signal.

3. A semiconductor device comprising:
    a power source section configured to step down a power source voltage to generate a step-down voltage, and to stop generation of the step-down voltage responsive to input of a stop signal;
    a control section configured to be driven by the step-down voltage generated by the power source section, and to output the stop signal to the power source section to stop generation of the step-down voltage; and
    a power source controller configured to prohibit input of the stop signal to the power source section until the step-down voltage becomes a predetermined value or greater,
    wherein the power source controller comprises
    a first N-channel MOS transistor having a gate electrode, a source electrode, and a bulk electrode connected to a ground voltage,
    a first P-channel MOS transistor having a source electrode and a bulk electrode connected to the power source voltage, and a gate electrode and a drain electrode connected to a drain electrode of the first N-channel MOS transistor,
    a second P-channel MOS transistor having a source electrode and a bulk electrode connected to the power source voltage, and a gate electrode connected to the gate electrode of the first P-channel MOS transistor and the drain electrode of the first N-channel MOS transistor,
    a second N-channel MOS transistor having a source electrode and a bulk electrode connected to the ground voltage, and a gate electrode and a drain electrode connected to a drain electrode of the second P-channel MOS transistor,
    a third N-channel MOS transistor having a source electrode and a bulk electrode connected to the ground voltage, and a gate electrode connected to the gate electrode of the second N-channel MOS transistor,
    a third P-channel MOS transistor having a source electrode and a bulk electrode connected to the step-down voltage, and a gate electrode and a drain electrode connected to a drain electrode of the third N-channel MOS transistor,
    a fourth P-channel MOS transistor having a source electrode and a bulk electrode connected to the power source voltage, and a gate electrode connected to the respective gate electrodes of the first P-channel MOS transistor and the second P-channel MOS transistor,
    a fourth N-channel MOS transistor having a source electrode and a bulk electrode connected to the ground voltage, a drain electrode connected to a drain electrode of the fourth P-channel MOS transistor, and a gate electrode connected to the respective drain electrodes of the third P-channel MOS transistor and the third N-channel MOS transistor, the fourth N-channel MOS transistor configured to switch ON when the step-down voltage becomes the predetermined value or greater and voltages of the respective drain electrodes of the third P-channel MOS transistor and the third N-channel MOS transistor have reached the predetermined value or greater, to place a drain electrode voltage of the fourth P-channel MOS transistor at a low level,
    a logic inverting circuit that is driven by the power source voltage, that has an input terminal connected to the respective drain electrodes of the fourth N-channel MOS transistor and the fourth P-channel MOS transistor, and that is configured to invert a signal input at the input terminal to provide an output signal, and an AND circuit configured to perform an AND computation of the output signal from the logic inverting circuit and the stop signal.

4. The semiconductor device of claim 3, further comprising:
a fifth P-channel MOS transistor having a source electrode connected to the drain electrode and the gate electrode of the third fifth P-channel MOS transistor, a bulk electrode connected to the step-down voltage, and a drain electrode and a gate electrode connected to the drain electrode of the third N-channel MOS transistor.

5. A power source control method comprising:
stepping down a power source voltage using a power source section to generate a step-down voltage, and stopping generation of the step-down voltage responsive to input of a stop signal;
outputting to the power source section the stop signal from a control section to stop generation of the step-down voltage, the control section driven by the step-down voltage; and
prohibiting input of the stop signal to the power source section using a power source controller until the step-down voltage becomes a predetermined value or greater,
wherein the power source controller comprises
a first N-channel MOS transistor having a gate electrode, a source electrode, and a bulk electrode connected to ground voltage,
a first P-channel MOS transistor having a source electrode and a bulk electrode connected to the power source voltage, and a gate electrode and a drain electrode connected to a drain electrode of the first N-channel MOS transistor,
a second P-channel MOS transistor having a source electrode and a bulk electrode connected to the power source voltage, and a gate electrode connected to the gate electrode of the first P-channel MOS transistor,
a second N-channel MOS transistor having a source electrode connected to the ground voltage, a gate electrode connected to the step-down voltage, and a drain electrode connected to a drain electrode of the second P-channel MOS transistor, and that switches ON when the step-down voltage becomes the predetermined value or greater to place a drain electrode potential of the second P-channel MOS transistor at a low level,
a logic inverting circuit that is driven by the power source voltage, that has an input terminal connected to the drain electrode of the second N-channel MOS transistor and the drain electrode of the second P-channel MOS transistor, and that inverts a signal input at the input terminal to provide an output signal, and
an AND circuit that performs an AND computation of the output signal from the logic inverting circuit and the stop signal.

6. The method of claim 5, further comprising:
stepping up the stop signal output from the control section to the voltage level of the power source voltage, and outputting the stop signal to the power source controller,
the power source section stopping generation of the step-down voltage responsive to input of the stepped up stop signal.

* * * * *